(12) United States Patent
Liu et al.

(10) Patent No.: US 10,969,298 B2
(45) Date of Patent: Apr. 6, 2021

(54) MULTI-DIMENSIONAL VIBRATION CONTROL METHOD FOR THE MODEL OF STRUT TAIL-SUPPORTED AIRCRAFT

(71) Applicant: DALIAN UNIVERSITY OF TECHNOLOGY, Liaoning (CN)

(72) Inventors: Wei Liu, Liaoning (CN); Mengde Zhou, Liaoning (CN); Bing Liang, Liaoning (CN); Linlin Tang, Liaoning (CN); Zhuang Yao, Liaoning (CN); Zhengquan Wen, Liaoning (CN); Yang Zhang, Liaoning (CN); Likun Si, Liaoning (CN); Zhenyuan Jia, Liaoning (CN)

(73) Assignee: DALIAN UNIVERSITY OF TECHNOLOGY, Liaoning (CN)

( * ) Notice: Subject to any disclaimer, the term of this patent is extended or adjusted under 35 U.S.C. 154(b) by 0 days.

(21) Appl. No.: 16/761,778

(22) PCT Filed: Sep. 20, 2019

(86) PCT No.: PCT/CN2019/106886
§ 371 (c)(1),
(2) Date: May 5, 2020

(87) PCT Pub. No.: WO2020/125109
PCT Pub. Date: Jun. 25, 2020

(65) Prior Publication Data
US 2020/0393327 A1     Dec. 17, 2020

(30) Foreign Application Priority Data

Dec. 18, 2018 (CN) .......................... 201811545677.8

(51) Int. Cl.
*G01M 9/04* (2006.01)
*B64F 5/60* (2017.01)
*G01P 15/02* (2013.01)
*H01L 41/187* (2006.01)
*G01M 9/06* (2006.01)
*H01L 41/08* (2006.01)

(52) U.S. Cl.
CPC ................. *G01M 9/04* (2013.01); *B64F 5/60* (2017.01); *G01M 9/062* (2013.01); *G01P 15/02* (2013.01);
(Continued)

(58) Field of Classification Search
None
See application file for complete search history.

(56) References Cited

U.S. PATENT DOCUMENTS 7,395,727 B2 *  7/2008  Moore ..................... G01L 5/226
                                                   33/559
9,354,134 B2 *  5/2016  Commo .................. G01L 25/00
(Continued)

FOREIGN PATENT DOCUMENTS

CN    102353513 A    2/2012
CN    105258916 A    1/2016
(Continued)

*Primary Examiner* — Peter J Macchiarolo
*Assistant Examiner* — Jermaine L Jenkins
(74) *Attorney, Agent, or Firm* — Muncy, Geissler, Olds & Lowe, P.C.

(57) ABSTRACT

A multi-dimensional vibration control method based on piezoelectric ceramic actuator applied to wind tunnel test of aircraft model. The pitch and yaw acceleration sensors arranged on the center of mass of the aircraft model are used to measure the two components of the main vibration acceleration of the aircraft model, and the main vibration vector of the aircraft model is obtained and the real-time vibration plane of the strut is determined. Inertia is introduced to solve the dynamic bending moment on the active section of the multi-dimensional vibration damper, and then the stress distribution on the active section is obtained. The multi-dimensional active vibration control system is adopted to improve the stability and reliability of the active vibration control system of wind tunnel model, extend the service life (Continued)

of piezoelectric ceramic actuator, and ensure the quality of wind tunnel test data and the safety of wind tunnel test.

2 Claims, 6 Drawing Sheets

(52) U.S. Cl.
CPC ........ *H01L 41/0825* (2013.01); *H01L 41/187* (2013.01)

(56) References Cited

U.S. PATENT DOCUMENTS

| | | | |
|---|---|---|---|
| 9,606,019 B2* | 3/2017 | Kordt | G01M 9/04 |
| 10,060,823 B2* | 8/2018 | McGranahan | G01M 9/062 |
| 10,267,708 B2* | 4/2019 | Skube | G01M 9/04 |
| 2018/0335364 A1 | 11/2018 | Skube et al. | |

FOREIGN PATENT DOCUMENTS

| | | |
|---|---|---|
| CN | 105784318 A | 7/2016 |
| CN | 105868535 A | 8/2016 |
| CN | 106441779 A | 2/2017 |
| CN | 107314883 A | 11/2017 |
| CN | 107462394 A | 12/2017 |
| CN | 107860550 A | 3/2018 |
| CN | 108132133 A | 6/2018 |
| CN | 108132134 A | 6/2018 |
| CN | 108227728 A | 6/2018 |
| CN | 108871724 A | 11/2018 |
| CN | 109668710 A | 4/2019 |
| EP | 3 382 363 A1 | 10/2018 |
| KR | 10-2014-0024109 A | 2/2014 |

* cited by examiner

MULTI-DIMENSIONAL VIBRATION CONTROL METHOD FOR THE MODEL OF STRUT TAIL-SUPPORTED AIRCRAFT

TECHNICAL FIELD

The present invention belongs to the field of active vibration control, and relates to a new multi-dimensional vibration control method for aircraft model based on piezoelectric ceramic actuator, which is applied to the wind tunnel test of aircraft model.

BACKGROUND

Wind tunnel test is an important means in the research and development of core equipment or components in aviation field. In full-mode measurement, pressure measurement and other tests, the aircraft model is fixed on the Angle of attack adjustment mechanism by connecting the force balance with the wind tunnel tail brace strut, which is a typical cantilever beam system. With the increase of the test angle of attack, the gas passing through the upper surface of the aircraft airfoil will no longer be attached to the airfoil surface and will fall off from the airfoil surface, and an eddy current will be generated behind the leading edge of the airfoil, resulting in random excitation to the aircraft model wing, coupled with the disturbance of the fluctuating air pressure in the wind tunnel itself and the wide-band unstable air flow such as the model wake flow. It causes the low-order multi-dimensional low-frequency large vibration of the model support system in the pitching plane, yaw plane and axis direction, especially in the case of transonic speed. This vibration will result in poor quality of measurement data, overload of sensor, and limitation of test envelope (angle of attack, etc.). If the test is not stopped in time, it will even cause damage to the cantilever beam support system and wind tunnel equipment, threatening the safety of wind tunnel test. Therefore, it is necessary to study the effective multi-dimensional vibration control method to improve the data quality of wind tunnel test and the integrity of test envelope (angle of attack, etc.), so as to ensure the safe and smooth conduct of wind tunnel test.

Generally speaking, the vibration control of wind tunnel aircraft model is divided into passive vibration control mode and active vibration control mode. The passive vibration control mode is limited to specific large-space model and specific working condition, and the corresponding speed is slow, so the vibration control effect is not ideal. Therefore, the active vibration control method with strong universality, fast response speed and large output power is the one with the most research and practical significance.

In recent years, the active vibration control system of wind tunnel model of aircraft research focused on the aircraft model pitching direction of vibration and vibration control tail brace strut structure research, Sun Yiyu, Shen Xing and others of Nanjing University of Aeronautics and Astronautics invented a patent "a kind of wind tunnel tail strut with flexure hinge to realize active vibration control", patent number is CN 207050948 U, a kind of wind tunnel tail strut for active vibration control with flexure hinge structure using a piezoelectric ceramic actuator is invented. the strut can realize vibration control structurally, but the effect of vibration control is limited. And the vibration control can only be realized in the pitch plane. The patent "an active vibration suppression device applied to wind tunnel model vibration suppression" invented by Yang Tiejun, Li Xinhui and others of Harbin Engineering University, patent number CN 108225714 A, invented a way to control the axial displacement of pitching and yaw piezoelectric ceramic components by arranging piezoelectric ceramics in pitching and yaw planes respectively, so that the test model produces pitching vibration and yaw vibration or their coupling vibration respectively, to realize vibration control. Although through the pitch and yaw vibrations of test model decoupling control can achieve certain vibration control effect, but the main process of aircraft model in wind tunnel test vibration in longitudinal direction, the yaw direction vibration smaller aircraft model, decorate in the yaw direction and longitudinal direction the same number of piezoelectric ceramic actuator is used to control a lot of the yaw direction of vibration is smaller, result in vibration control of a large amount of waste, and to decompose the vibration in pitch and yaw plane respectively to control, not to the original main vibration control of the flying model, control process, the stability and reliability of the control system are affected when the piezoelectric ceramic components work in different planes.

SUMMARY

The technical problems to be solved by the present invention is to overcome the defects in the prior art Aiming at the existing unidimensional vibration active control system is unable to effectively solve the multi-dimensional vibration generated during the process of the aircraft model wind tunnel test, which seriously affects the quality of test data and threatens the security of the wind tunnel test, a multi-dimensional vibration control method for the model of strut tail-supported aircraft is invented. The method adopts the active vibration control method, and the main vibration vector of the aircraft model is calculated through the arrangement in the center of mass of the aircraft model pitch and yaw acceleration sensor measuring acceleration component, and then determine the strut real-time vibration plane in the space. On the real-time vibration plane of the strut, the dynamic bending moment and stress distribution on the active cross section of the multi-dimensional vibration damper are calculated by the inertial force. According to the spatial position of the real-time vibration plane of the strut, determine the serial number of the piezoelectric ceramic actuator working in the multi-dimensional vibration damper and calculate the vibration control force in real-time. Then the reverse bending moment is generated to resist the dynamic bending moment in the process of aircraft model vibration, so as to achieve the purpose of vibration control. This method can effectively control the low-order, multi-dimensional, low-frequency and large amplitude vibration of the aircraft model in pitch plane, yaw plane and axial direction, and ensure the reasonable and efficient output of the control force of the piezoelectric ceramic actuator.

The technical solution adopted by the invention is:

a multi-dimensional vibration control method for the support tail-supported aircraft model, the method is through the arrangement in the aircraft model on the center of mass of pitch and yaw acceleration sensor measuring aircraft model, the main vibration acceleration of two component, calculate the main vibration vector and determine the strut real-time aircraft model plane, introduction of inertial force to solve the multi-dimensional active vibration damper on cross section by dynamic bending moment, and then obtain the initiative stress distribution on cross section, through the real-time vibration plane space position relation of multi-dimensional vibration damper to participate in the work of piezoelectric ceramic actuator serial number. The vibration control force is calculated in real time according to the stress on the active section of the piezoelectric ceramic actuator, and then the dynamic bending moment is generated in the process of the reverse bending moment resisting the vibration of the aircraft model. The multi-dimensional vibration active control system based on piezoelectric ceramic actuator is adopted to control the multi-dimensional vibration. The specific steps are as follows:

Step 1: establish the absolute coordinate system of the aircraft model support system The absolute coordinate system OXYZE is established on the aircraft tail strut 4, and the coordinate origin is established in the equilibrium position at the intersection of the active section F and the axis of the aircraft tail strut 4, which is defined as O; the direction of the X axis coincides with the balance position of the axis of aircraft tail strut 4 and points to the aircraft model 5, the direction of the Y axis is that the intersection of the active section F and the pitching plane points upward; the Z axis is determined by the right manipulation. The vibration measurement coordinate system $O_A X_A Y_A Z_A A$ is established on the aircraft model 5, whose origin is established at the intersection of the centroid of the aircraft model 5 and the X axis of the absolute coordinate system OXYZE, which is defined as that the direction of the $O_A$; $X_A$ coordinate axis coincides with the X axis of the absolute coordinate system OXYZE, the $Y_A$ coordinate axis and the Y axis of the absolute coordinate system OXYZE point upward, and the $Z_A$ coordinate axis is determined by right manipulation.

Step 2: Obtain the components of the main vibration acceleration in the pitch plane and yaw plane in real time Using the pitching accelerometer 6 and the yaw accelerometer 7 at the centroid of the aircraft model 5 to measure the acceleration of the main vibration in the pitch plane and yaw plane perpendicular to each other, the acceleration of the main vibration is fed back to the real-time controller 8 controlled by the upper computer 9, and a plurality of acceleration sampling values of the pitch plane and the yaw plane are collected in each vibration control cycle, the acceleration components of the main vibration acceleration in the pitch direction and yaw direction in a vibration control cycle are calculated by formulas (1) and (2) respectively:

$$a_{pith}(t) = \frac{\sum_{i=1}^{N} a_{pithi}}{N} \quad (1)$$

$$a_{yaw}(t) = \frac{\sum_{i=1}^{N} a_{yawi}}{N} \quad (2)$$

Among them, the acceleration component of the $a_{pithi}(t)$ main vibration acceleration in the pitch direction, the acceleration component of the $a_{yawi}(t)$ main vibration acceleration in the yaw direction, $a_{pithi}(t)$, $a_{yawi}(t)$ is the acceleration sampling value of the aircraft model 5 in the pitching plane and the yaw plane at the i (i=1, 2, . . . N) sampling time, and N is the number of acceleration sampling values in each vibration control cycle.

Step 3: solve the main vibration acceleration vector in real time

The main vibration acceleration is obtained by combining the acceleration components in the pitching direction and yaw direction. The main vibration acceleration consists of magnitude and direction. The main vibration acceleration vector is constructed by solving the magnitude and direction of the main vibration acceleration vector in each vibration control cycle in real time by using formulas (3) and (4):

$$|a(t)| = \sqrt{a_{pith}^2 + a_{yaw}^2} \quad (3)$$

$$\angle a(t) = \arctan\left(\frac{a_{pith}(t)}{a_{yaw}(t)}\right), \angle a(t) \in (-\pi, \pi) \quad (4)$$

Among them, a(t) is the main vibration acceleration vector, |a(t)| is the magnitude of the vibration acceleration vector a(t), and ∠a(t) is the main vibration acceleration vector a(t) in directions.

Step 4: establish the real-time vibration active control coordinate system of the aircraft model and determine the real-time vibration plane of the strut The real-time active vibration control coordinate system $O_\alpha X_\alpha Y_\alpha Z_\alpha D$ is established on the active section F, and its origin coincides with the origin O of the absolute coordinate system OXYZ E. It is defined that the direction of the $O_\alpha$. $X_\alpha$ axis coincides with the direction of the X coordinate of the absolute coordinate OXYZ E, the $Y_\alpha$ axis coincides with the a(t) direction of the main vibration acceleration vector, and the $Z_\alpha$ coordinate axis is determined by the right manipulation. Plane $X_\alpha O_\alpha Y_\alpha$ is the real-time vibration plane $X_\alpha O_\alpha Y_\alpha C$ of the strut. Because of the randomness of the vibration of the aircraft model 5, the real-time active vibration control coordinate system $O_\alpha X_\alpha Y_\alpha Z_\alpha D$ changes with time, and the real-time vibration plane $X_\alpha O_\alpha Y_\alpha C$ changes with time.

Step 5: the real-time inertial force and the stress distribution on the active cross section of the support system are solved On the real time vibration plane $X_\alpha O_\alpha Y_\alpha C$ of the support bar, the inertia force is solved in real time by formula (5)

$$F_I(t) = -m_{eq} a(t) \quad (5)$$

Formula (6) was used to calculate the dynamic bending moment on the active section F in real time $$M(t) = F_I(t) \cdot L \quad (6)$$

The dynamic stress distribution on the active cross section F was solved in real time by formula (7)

$$\sigma(y_a, z_a, t) = \frac{M(t) \cdot y_\alpha}{I_{z_\alpha}(t)} \quad (7)$$

Among them, $m_{eq}$ is the equivalent mass of the support system, $F_I(t)$ is the real-time inertia force acting on the aircraft model 5, M(t) is the dynamic bending moment on the active cross section F of the aircraft model 5 during vibration, L is the distance from the centroid of the aircraft model 5 to the active cross section F, $\sigma(y_a, z_a t)$ is the dynamic stress at the length of the active section F inner distance $X_\alpha$ coordinate axis $y_a$, and $I_{z_o}(t)$ is the real time inertia moment of the active cross section F to the $Z_\alpha$ coordinate axis.

Step 6: Determine the sequence number of the piezoelectric actuator in real time and calculate the vibration control force A number of piezoelectric ceramic actuators 3-1 are uniformly arranged in the circumferential direction of the multi-dimensional vibration damper 3 at the active section F, the uniformly distributed circumferential radius is R, and the piezoelectric ceramic which coincides with the Z axis of the absolute coordinate system OXYZE is set as No. 0 piezoelectric ceramic actuator 3-1, the No. 1 piezoelectric ceramic actuator 3-1, the No. 2 piezoelectric ceramic actuator 3-1, ..., the No. n piezoelectric ceramic actuator 3-1, are arranged in a counterclockwise circular array in turn. The array angle between the two adjacent piezoelectric ceramic actuators 3-1 is $$\Delta\alpha = \frac{2\pi}{n+1}.$$

In the real-time active vibration control coordinate system $O_\alpha X_\alpha Y_\alpha Z_\alpha D$, the piezoelectric ceramic actuator 3-1 above the $Z_\alpha$ axis participates in the vibration control, and the serial number of the piezoelectric ceramic actuator 3-1 participating in the work is $$n_c \in \left[\mathrm{INT}\left(\frac{\alpha(t) - \frac{\pi}{2}}{\Delta\alpha} + 1\right), \mathrm{INT}\left(\frac{\alpha(t) + \frac{\pi}{2}}{\Delta\alpha}\right)\right] \quad (8)$$

Among them, $$\mathrm{INT}\left(\frac{\alpha(t) - \frac{\pi}{2}}{\Delta\alpha} + 1\right) \text{ and } \mathrm{INT}\left(\frac{\alpha(t) + \frac{\pi}{2}}{\Delta\alpha}\right)$$

represent the rounding of the calculated values of $$\frac{\alpha(t) - \frac{\pi}{2}}{\Delta\alpha} + 1 \text{ and } \frac{\alpha(t) + \frac{\pi}{2}}{\Delta\alpha}$$

respectively, $\alpha(t)$ the angle between the main vibration acceleration vector $a(t)$ and the Z axis of the absolute coordinate system OXYZ (E), and then the real-time coordinates of the piezoelectric ceramic actuator 3-1 center in the active vibration control coordinate system $O_\alpha X_\alpha Y_\alpha Z_\alpha D$ are determined as follows:

$$(z_{\alpha n_c}(t), y_{\alpha n_c}(t)) = \left(R \cdot \cos\left[\alpha_{n_c} - \left(\alpha(t) - \frac{\pi}{2}\right)\right], R \cdot \sin\left[\alpha_{n_c} - \left(\alpha(t) - \frac{\pi}{2}\right)\right]\right) \quad (9)$$

Where, $\alpha_{n_c}$ is the angle between the working piezoelectric actuator 3-1 and the Z axis direction of the absolute coordinate system OXYZE, and the resultant force on the active section F of the working piezoelectric actuator 3-1 is:

$$F_{n_c}(t) = \int_{A_{n_c}} \sigma(y_a, z_a, t) dA_{n_c} \quad (10)$$

Where, $A_{n_c}$ is the contact area between the no. $n_c$ participating piezoelectric ceramic actuator 3-1 and the active section F, and the resistance required by the no. $n_c$ participating piezoelectric ceramic actuator 3-1 is:

$$F_{Rn_c}(t) = -F_{n_c}(t) \quad (11)$$

Finally, all the piezoelectric ceramic actuators 3-1 generate a reverse bending moment $M_R(t)$ to resist the dynamic bending moment $M(t)$ generated during the vibration of the aircraft model 5.

The multi-dimensional vibration control method for the model of the strut tail-supported aircraft adopts the multi-dimensional vibration active control system, which is mainly composed of pitch acceleration sensor 6, yaw acceleration sensor 7, real-time controller 8, upper computer 9, piezoelectric ceramic actuator power amplifier group 10 and multi-dimensional vibration damper 3. The pitch acceleration sensor 6 is installed on the centroid of the aircraft model 5 in the pitching plane and is used to measure the vibration acceleration component of the main vibration of the aircraft model 5 in the pitching plane; the yaw acceleration sensor 7 is installed on the centroid of the aircraft model 5 in the yaw plane and is used to measure the vibration acceleration component of the main vibration of the aircraft model 5 in the yaw plane; the multi-dimensional vibration damper 3 includes a plurality of uniformly distributed piezoelectric ceramic actuators 3-1, each of which is pretightened by a pretightening mechanism 3-2, respectively, to ensure the reliable output of the dynamic force of the piezoelectric ceramic actuator 3-1. The multi-dimensional vibration damper 3 is installed in the real-time vibration plane $X_\alpha O_\alpha Y_\alpha C$ of the aircraft tail strut four struts, the real-time controller 8 is connected with the upper computer 9, and the upper computer 9 is used to control the real-time controller 8 and monitor the vibration control process. The real-time controller 8 is connected with the pitch acceleration sensor 6 and the yaw acceleration sensor 7 respectively to obtain the vibration acceleration components in the pitching plane and the yaw plane of the aircraft model 5 in real time; the real-time controller 8 is connected to a piezoelectric ceramic actuator power amplifier group 10, and a plurality of piezoelectric ceramic actuator power amplifiers 10-1 in the piezoelectric ceramic actuator power amplifier group 10 are respectively connected to a plurality of piezoelectric ceramic actuators 3-1 in the multi-dimensional vibration damper 3.

The Benefits of the Present Invention:

Compared with the existing active vibration control system of wind tunnel vehicle model and the method thereof, the present method and system can realize effective control of low-order multi-dimensional low-frequency significant vibration for the aircraft model on pitch plane and yaw plane and the axis direction in transonic wind tunnel experiment. The calculation method of vibration control force is presented to ensure the reasonable and efficient output of actuator control force in the process of random vibration control, avoid the existing different plane piezoelectric ceramic components interact with each other at work, prolong the service life of the piezoelectric ceramic actuator, improve the active vibration control system stability and reliability of wind tunnel model. Furthermore, the quality of wind tunnel test data and the safety of wind tunnel test are ensured.

DETAILED DESCRIPTION

The specific implementation method of the invention is described in detail below in combination with the technical scheme and the attached drawings.

Figure 2:
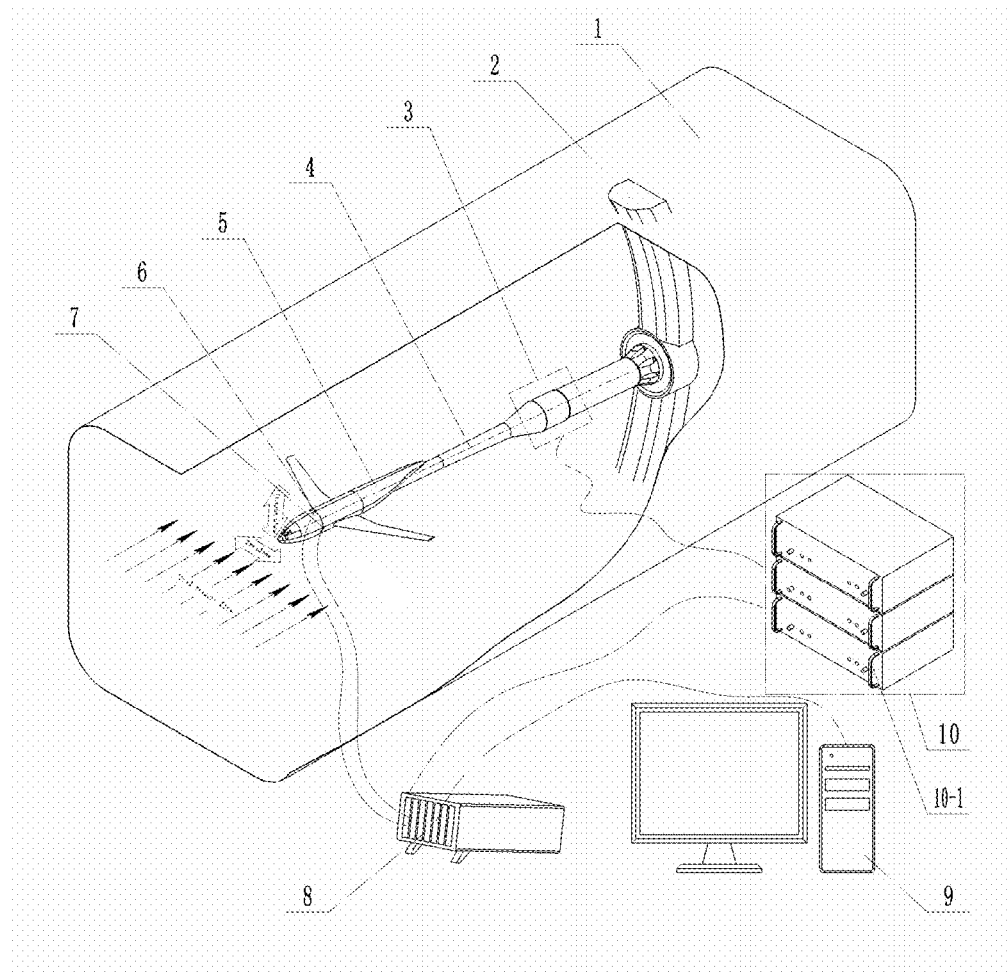
FIG. 2 is the diagram of multi-dimensional vibration active control system based on piezoelectric ceramic actuator. Among them, 1—wind tunnel test section, 2—angle of attack adjustment mechanism, 3—multi-dimensional vibration damper, 3-1 piezoelectric ceramic actuator, 3-2 pretightening mechanism, 4—aircraft tail strut, 5—aircraft model, 6—pitch acceleration sensor, 7—yaw acceleration sensor, 8—real-time controller, 9—upper computer, 10—piezoelectric ceramic actuator power amplifier group, 10-1 piezoelectric ceramic actuator power amplifier.
Figure 4:
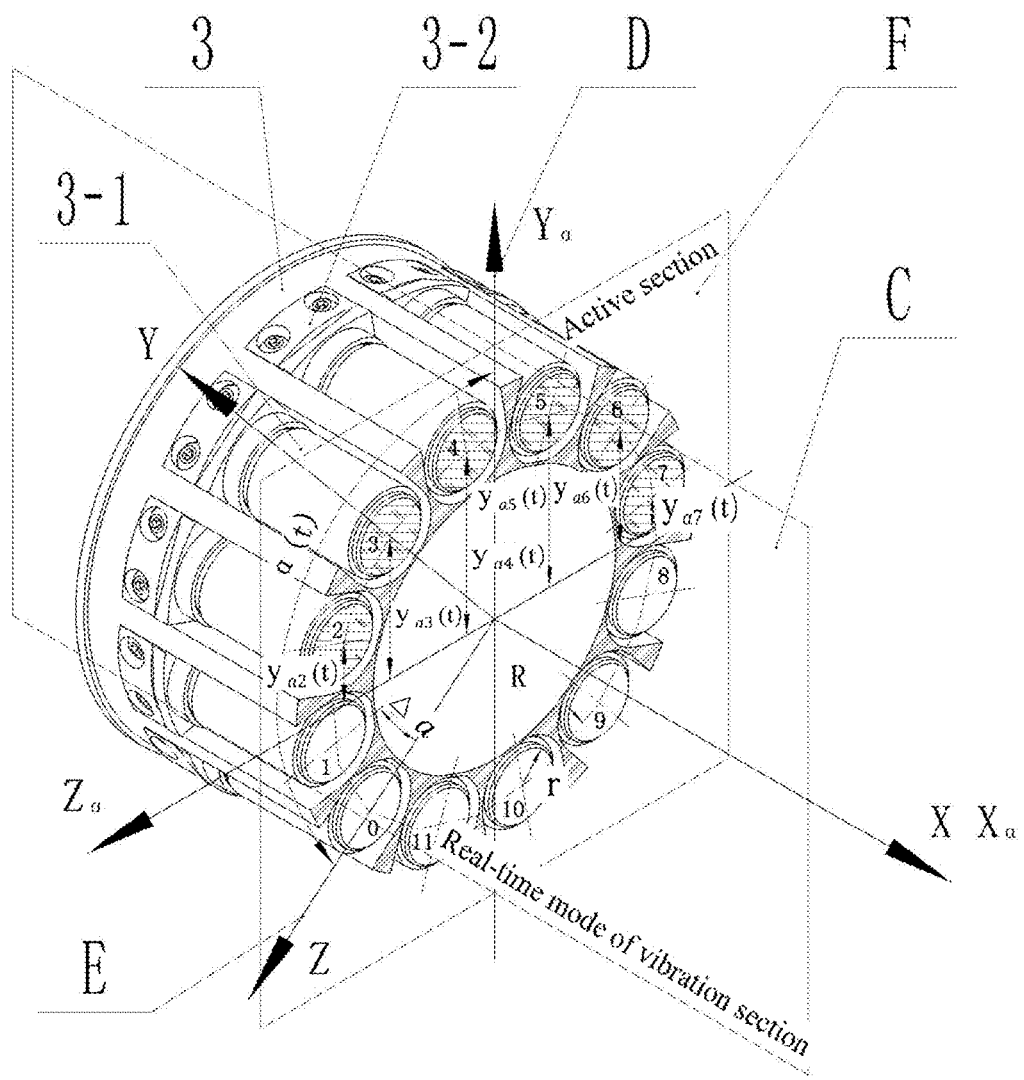
FIG. 4 is the composition of shock absorber.
Figure 5:
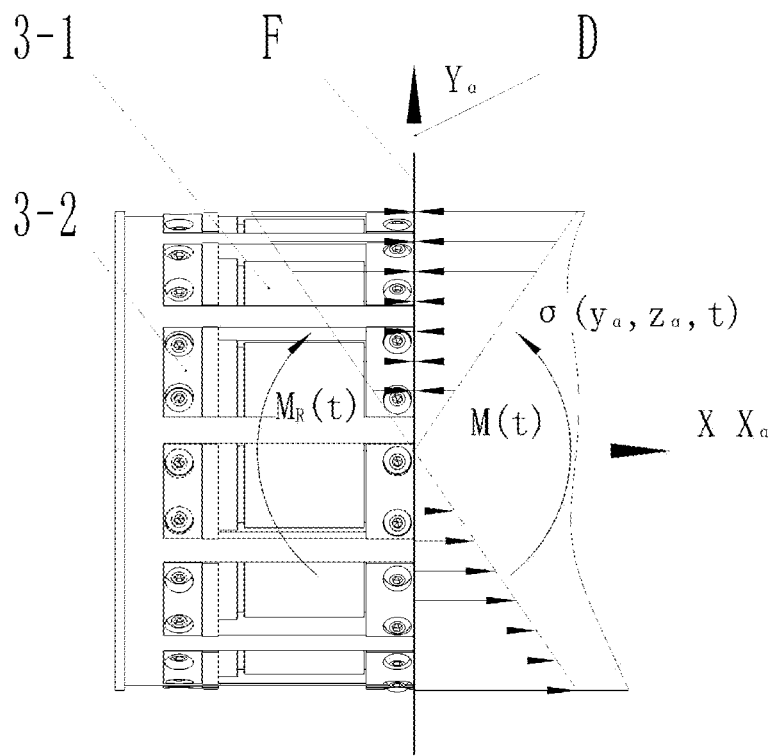
FIG. 5 is the working principle diagram of shock absorber.

As shown in FIG. 2 and FIG. 4, the multi-dimensional active vibration control system is mainly composed of the pitch acceleration sensor 6, yaw acceleration sensor 7, real-time controller 8, upper computer 9, piezoelectric ceramic actuator power amplifier group 10 and multi-dimensional vibration damper 3. The pitch acceleration sensor 6 is installed on the centroid of the aircraft model 5 in the pitching plane and is used to measure the vibration acceleration component of the main vibration of the aircraft model 5 in the pitching plane. The yaw acceleration sensor 7 is installed on the centroid of the aircraft model 5 in the yaw plane and is used to measure the vibration acceleration component of the main vibration of the aircraft model 5 in the yaw plane. The multi-dimensional vibration damper 3 contains multiple piezoelectric ceramic actuators 3-1. In this example, 12 piezoelectric ceramic actuators 3-1 are used. Each piezoelectric ceramic actuator 3-1 is pretightened through the pretightening mechanism 3-2 respectively to ensure the reliable output of the piezoelectric ceramic actuator 3-1 dynamic force. The multidimensional vibration damper 3 is installed at the fixed end of the aircraft tail support rod 4, and the real-time controller 8 is connected to the upper computer 9, which is used to control the real-time controller 8 and the vibration control process monitoring. The real-time controller 8 is connected to the pitch acceleration sensor 6 and yaw acceleration sensor 7 respectively to obtain the vibration acceleration components in the pitch plane and yaw plane of the aircraft model 5 in real time. The real-time controller 8 is connected to the piezoelectric ceramic actuator power amplifier set 10, and there are 12 piezoelectric ceramic actuator power amplifiers 10-1 in the piezoelectric ceramic actuator power amplifier set 10, which are connected to 12 piezoelectric ceramic actuator 3-1 in the multi-dimensional vibration damper 3.

Figure 1:
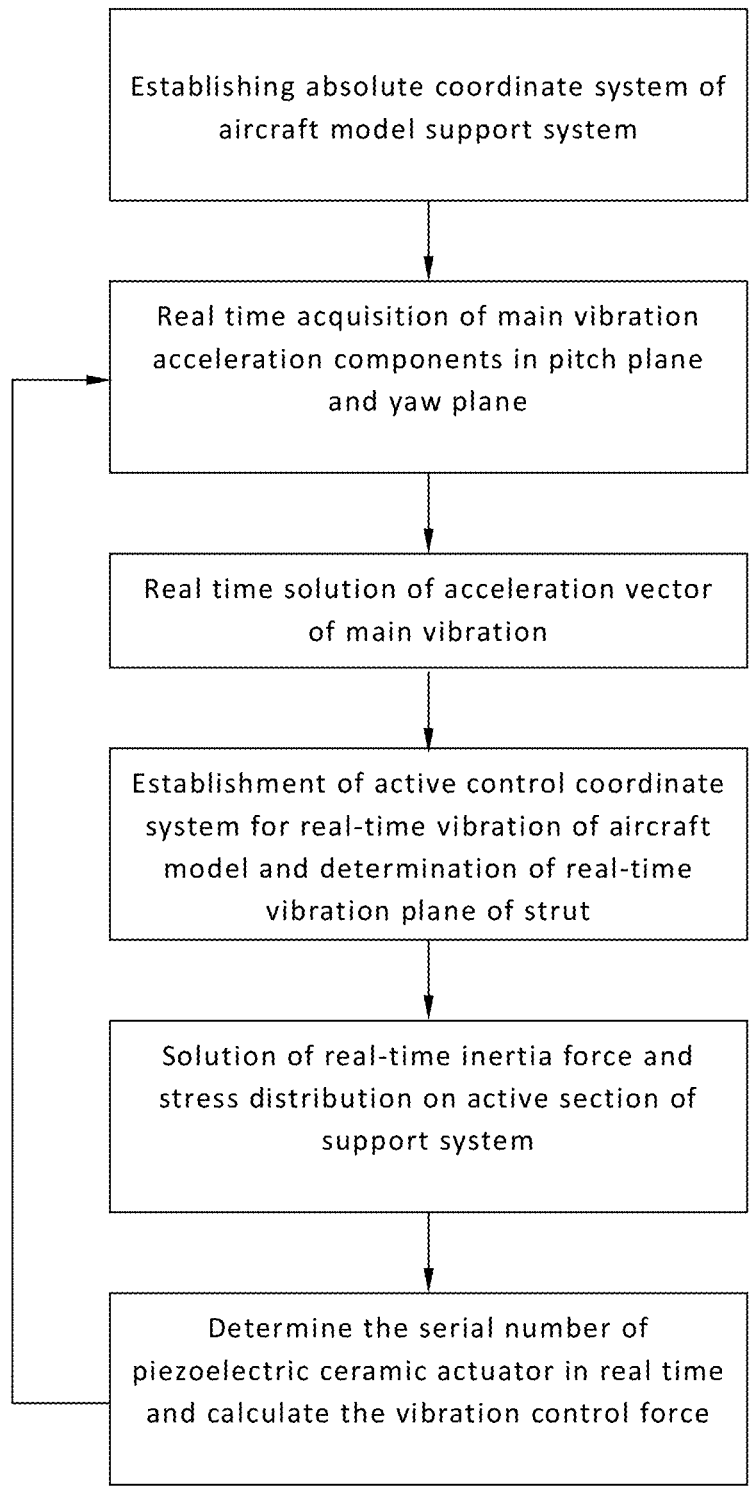
FIG. 1 is the flow chart of the multi-dimensional vibration control method for the model of the supporting strut tail-supported aircraft.
Figure 3:
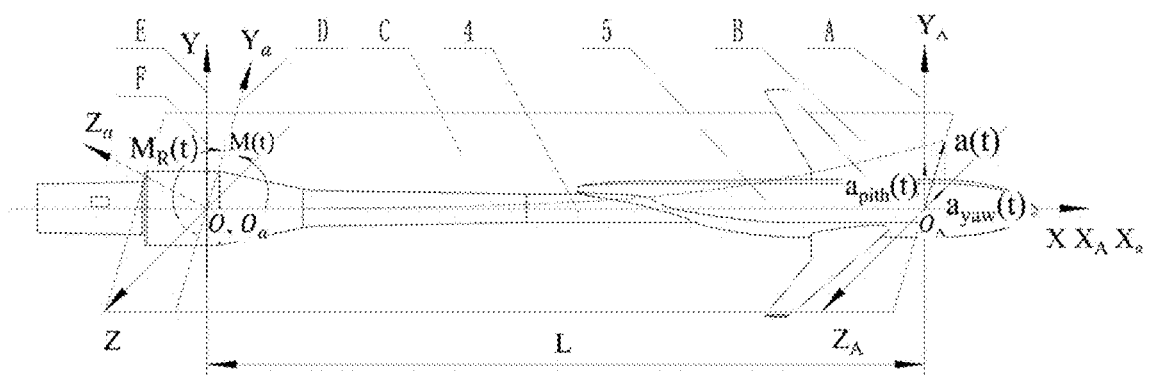
FIG. 3 is the schematic diagram of random vibration of the aircraft model and the arrangement of coordinates $O_A X_A Y_A Z_A$. Among them, A-aircraft model vibration measurement coordinate system, B-strut real-time vibration deflection, C-strut real-time vibration plane $X_\alpha O_\alpha Y_\alpha$, D-real-time vibration active control coordinate system $O_\alpha X_\alpha Y_\alpha Z_\alpha$, E-absolute coordinate system OXYZ, F-active cross section.

FIG. 1 is a flow chart of a multi-dimensional vibration control method for a strut tail-supported aircraft model, which adopts a pitch acceleration sensor 6 and a yaw acceleration sensor 7 arranged at the centroid of the aircraft model 5 to measure the vibration acceleration components $a_{pith}(t)$ and $a_{yaw}(t)$ of the main vibration in the mutually perpendicular pitch plane and the yaw plane respectively, and feedback them to the real-time controller 8 controlled by the upper computer 9. The real-time controller 8 calculates the main vibration acceleration vector a(t) in real time and determines the real-time vibration plane $X_\alpha O_\alpha Y_\alpha$ C of the supporting rod, calculates the dynamic bending moment M(t) on the active section F of the multi-dimensional vibration damper 3 through the inertia force $F_I(t)$, and then obtains the stress distribution on the active section F. The serial number of the piezoelectric ceramic actuator 3-1 in the multi-dimensional vibration damper 3 is determined through the spatial position relationship of the real-time vibration plane $X_\alpha O_\alpha Y_\alpha$ C of the supporting rod, and the vibration control force is calculated in real time according to the stress of the piezoelectric ceramic actuator 3-1 on the active section F, and then the reverse bending moment $M_R(t)$ is generated to resist the dynamic bending moment M(t), produced in the vibration process of aircraft model 5, so as to achieve the effect of vibration reduction. The specific steps of the multi-dimensional vibration control method for the support tail-supported aircraft model are as follows:

Step 1: establish the absolute coordinate system of the aircraft model support system As shown in FIG. 3, the absolute coordinate system OXYZE is established on the aircraft tail strut 4, and the coordinate origin is established in the equilibrium position at the intersection of the active section F and the axis of the aircraft tail strut 4, which is defined as O; the direction of the X axis coincides with the balance position of the axis of aircraft tail strut 4 and points to the aircraft model 5, the direction of the Y axis is that the intersection of the active section F and the pitching plane points upward; the Z axis is determined by the right manipulation. The vibration measurement coordinate system $O_A X_A Y_A Z_A$ A is established on the aircraft model 5, whose origin is established at the intersection of the centroid of the aircraft model 5 and the X axis of the absolute coordinate system OXYZE, which is defined as that the direction of the $O_A$; $X_A$ coordinate axis coincides with the X axis of the absolute coordinate system OXYZE, the $Y_A$ coordinate axis and the Y axis of the absolute coordinate system OXYZE point upward, and the $Z_A$ coordinate axis is determined by right manipulation.

Step 2: Obtain the components of the main vibration acceleration in the pitch plane and yaw plane in real time Using the pitching accelerometer 6 and the yaw accelerometer 7 at the centroid of the aircraft model 5 to measure the acceleration of the main vibration in the pitch plane and yaw plane perpendicular to each other, the acceleration of the main vibration is fed back to the real-time controller 8 controlled by the upper computer 9, and a plurality of acceleration sampling values of the pitch plane and the yaw plane are collected in each vibration control cycle, the acceleration components of the main vibration acceleration in the pitch direction and yaw direction in a vibration control cycle are calculated by formulas (1) and (2) respectively:

$$a_{pith}(t) = \frac{\sum_{i=1}^{N} a_{pithi}}{N} \qquad (1)$$

$$a_{yaw}(t) = \frac{\sum_{i=1}^{N} a_{yawi}}{N} \qquad (2)$$

Among them, the acceleration component of the $a_{pith}(t)$ main vibration acceleration in the pitch direction, the acceleration component of the $a_{yaw}(t)$ main vibration acceleration in the yaw direction, $a_{pithi}(t)$, $a_{yawi}(t)$ is the acceleration sampling value of the aircraft model 5 in the pitching plane and the yaw plane at the i (i=1, 2, ... N) sampling time, and N is the number of acceleration sampling values in each vibration control cycle.

Step 3: solve the main vibration acceleration vector in real time

The main vibration acceleration a(t) is obtained by combining the acceleration components in the pitching direction $a_{pith}(t)$ and yaw direction $a_{yaw}(t)$. The main vibration acceleration a(t) consists of magnitude and direction. The main vibration acceleration vector a(t) is constructed by solving the magnitude and direction of the main vibration acceleration vector a(t) in each vibration control cycle in real time by using formulas (3) and (4):

$$|a(t)| = \sqrt{a_{pith}^2 + a_{yaw}^2} \qquad (3)$$

$$\angle a(t) = \arctan\left(\frac{a_{pith}(t)}{a_{yaw}(t)}\right),\ \angle a(t) \in (-\pi, \pi) \qquad (4)$$

Among them, a(t) is the main vibration acceleration vector, |a(t)| is the magnitude of the vibration acceleration vector a(t), and ∠a(t) is the main vibration acceleration vector a(t) in directions.

Step 4: establish the real-time vibration active control coordinate system of the aircraft model and determine the real-time vibration plane of the strut The real-time active vibration control coordinate system $O_A X_A Y_A Z_A D$ is established on the active section F, and its origin coincides with the origin O of the absolute coordinate system OXYZ E. It is defined that the direction of the $O_\alpha$-$X_\alpha$ axis coincides with the direction of the X coordinate of the absolute coordinate OXYZ E, the $Y_\alpha$ axis coincides with the a(t) direction of the main vibration acceleration vector, and the $Z_\alpha$ coordinate axis is determined by the right manipulation. Plane $X_\alpha O_\alpha Y_\alpha$ is the real-time vibration plane $X_\alpha O_\alpha Y_\alpha C$ of the strut. Because of the randomness of the vibration of the aircraft model 5, the real-time active vibration control coordinate system $O_\alpha X_\alpha Y_\alpha Z_\alpha D$ changes with time, and the real-time vibration plane $X_\alpha O_\alpha Y_\alpha C$ changes with time.

Step 5: the real-time inertial force and the stress distribution on the active cross section of the support system are solved On the real time vibration plane $X_\alpha O_\alpha Y_\alpha C$ of the support bar, the inertia force is solved in real time by formula (5)

$$F_I(t) = -m_{eq} a(t) \qquad (5)$$

Formula (6) was used to calculate the dynamic bending moment on the active section F in real time $$M(t) = F_I(t) \cdot L \qquad (6)$$

The dynamic stress distribution on the active cross section F was solved in real time by formula (7)

$$\sigma(y_a, z_a, t) = \frac{M(t) \cdot y_a}{I_{z_\alpha}(t)} \qquad (7)$$

Among them, $m_{eq}$ is the equivalent mass of the support system, $F_I(t)$ is the real-time inertia force acting on the aircraft model 5, M(t) is the dynamic bending moment on the active cross section F of the aircraft model 5 during vibration, L is the distance from the centroid of the aircraft model 5 to the active cross section F, $\sigma(y_a, z_a, t)$ is the dynamic stress at the length of the active section F inner distance $X_\alpha$ coordinate axis $y_a$, and $I_{z_\alpha}(t)$ is the real time inertia moment of the active cross section F to the 4 coordinate axis.

Step 6: Determine the sequence number of the piezoelectric actuator in real time and calculate the vibration control force As shown in FIG. 4, in this example a number of piezoelectric ceramic actuators 3-1 are uniformly arranged in the circumferential direction of the multi-dimensional vibration damper 3 at the active section F, the uniformly distributed circumferential radius is R, and the piezoelectric ceramic which coincides with the Z axis of the absolute coordinate system OXYZE is set as No. 0 piezoelectric ceramic actuator 3-1, the No. 1 piezoelectric ceramic actuator 3-1, the No. 2 piezoelectric ceramic actuator 3-1, . . . , the No. n piezoelectric ceramic actuator 3-1, are arranged in a counterclockwise circular array in turn. The array angle between the two adjacent piezoelectric ceramic actuators 3-1 is $$\Delta\alpha = \frac{2\pi}{n+1}.$$

In the real-time active vibration control coordinate system $O_\alpha X_\alpha Y_\alpha Z_\alpha D$, the piezoelectric ceramic actuator 3-1 above the $Z_\alpha$ axis participates in the vibration control, and the serial number of the piezoelectric ceramic actuator 3-1 participating in the work is $$n_c \in \left[\mathrm{INT}\left(\frac{\alpha(t) - \frac{\pi}{2}}{\Delta\alpha} + 1\right),\ \mathrm{INT}\left(\frac{\alpha(t) + \frac{\pi}{2}}{\Delta\alpha}\right)\right] \qquad (8)$$

Among them, $$\mathrm{INT}\left(\frac{\alpha(t) - \frac{\pi}{2}}{\Delta\alpha} + 1\right) \text{ and } \mathrm{INT}\left(\frac{\alpha(t) + \frac{\pi}{2}}{\Delta\alpha}\right)$$

represent the rounding of the calculated values of $$\frac{\alpha(t)-\frac{\pi}{2}}{\Delta\alpha}+1 \text{ and } \frac{\alpha(t)+\frac{\pi}{2}}{\Delta\alpha}$$

respectively, α(t) the angle between the main vibration acceleration vector a(t) and the Z axis of the absolute coordinate system OXYZ (E), and then the real-time coordinates of the piezoelectric ceramic actuator 3-1 center in the real-time active vibration control coordinate system $O_\alpha X_\alpha Y_\alpha Z_\alpha D$ are determined as follows:

$$(z_{an_c}(t), y_{an_c}(t)) = \qquad (9)$$
$$(R \cdot \cos[\alpha_{n_c} - (\alpha(t) - \frac{\pi}{2})], R \cdot \sin[\alpha_{n_c} - (\alpha(t) - \frac{\pi}{2})])$$

Where, $\alpha_{n_c}$ is the Angle between the working piezoelectric actuator 3-1 and the Z axis direction of the absolute coordinate system OXYZE, and the resultant force on the active section F of the working piezoelectric actuator 3-1 is:

$$F_{n_c}(t) = \int_{A_{n_c}} \sigma(y_a, z_a, t) dA_{n_c} \qquad (10)$$

Where, $$A_{n_c}$$

is the contact area between the no. $n_c$ participating piezoelectric ceramic actuator 3-1 and the active section F, and the resistance required by the no. $n_c$ participating piezoelectric ceramic actuator 3-1 is:

$$F_{Rn_c}(t) = -F_{n_c}(t) \qquad (11)$$

Finally, all the piezoelectric ceramic actuators 3-1 generate a reverse bending moment $M_R(t)$ to resist the dynamic bending moment M(t) generated during the vibration of the aircraft model 5.

Figure 6:
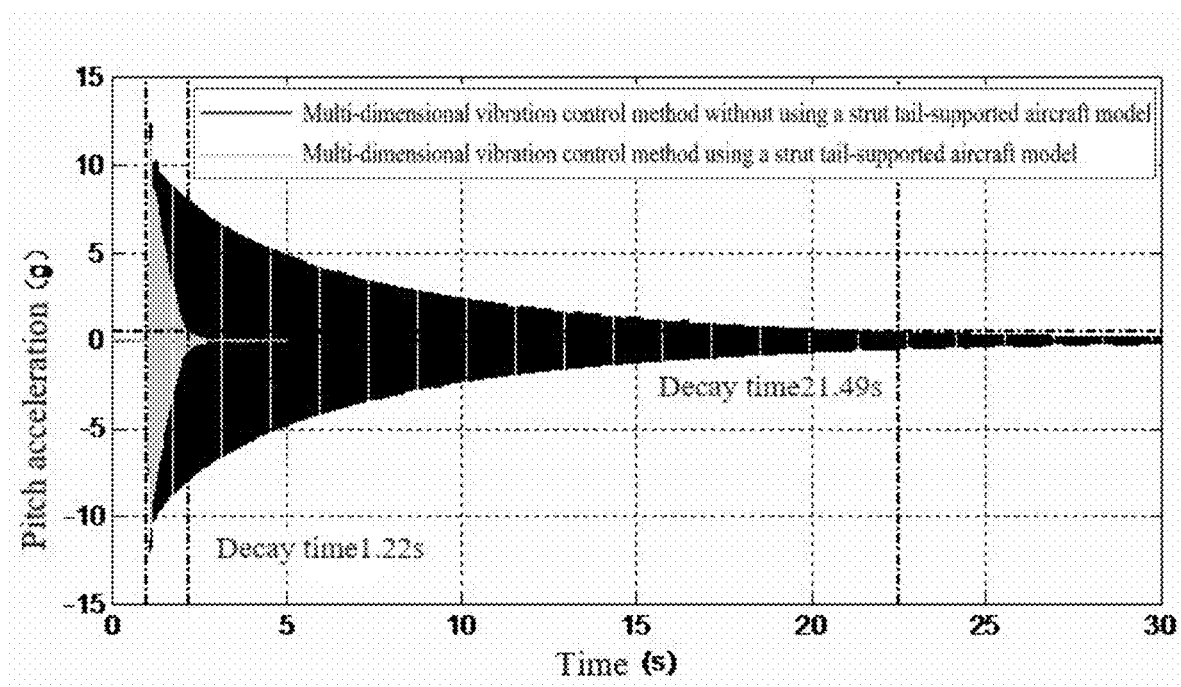
FIG. 6 shows the comparison of pitch acceleration before and after using multi-dimensional vibration control method of strut tail-supported aircraft model when hammering in pitch direction. Abscissa is time, unit s, ordinate is acceleration, unit is g.
Figure 7:
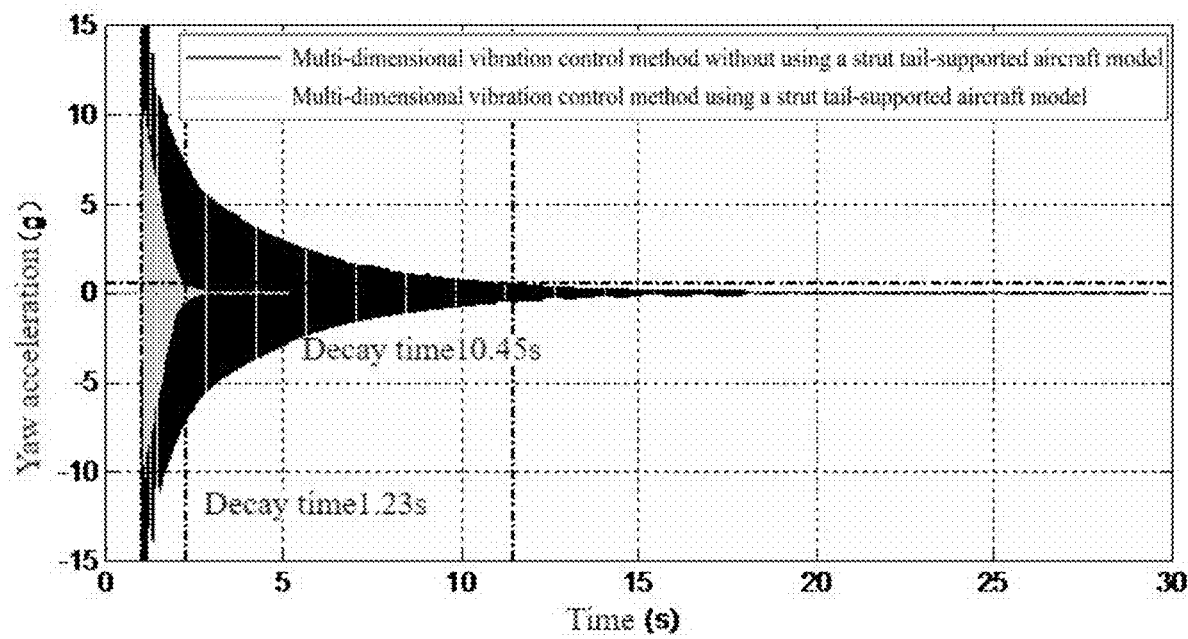
FIG. 7 shows the comparison of yaw acceleration before and after using multi-dimensional vibration control method of strut tail-supported aircraft model when hammering in the yaw direction. Abscissa is time, unit s, ordinate is acceleration, unit is g.
Figure 8:
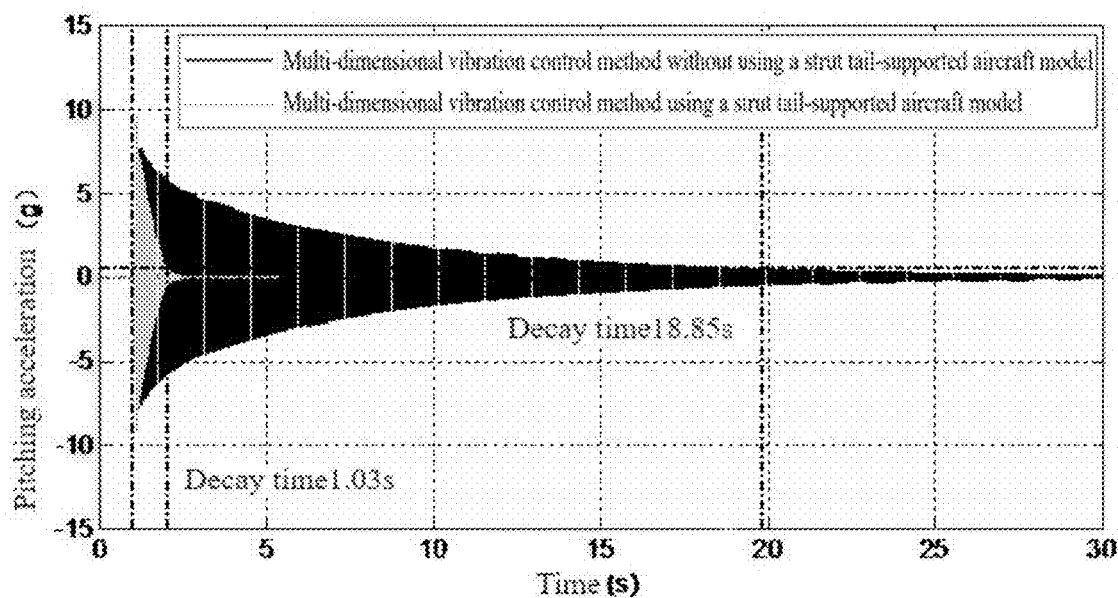
FIG. 8 is the comparison diagram of pitch acceleration before and after using multi-dimensional vibration control method for hammer strike in an arbitrary direction.
Figure 9:
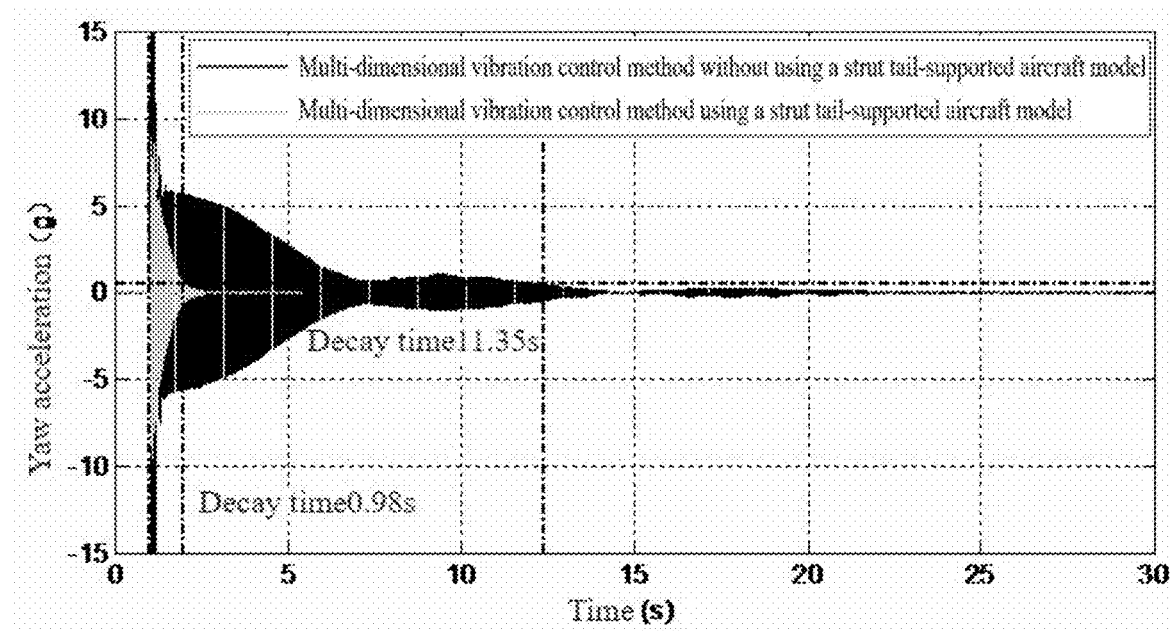
FIG. 9 is the comparison diagram of yaw acceleration using multi-dimensional vibration control method for hammer strike in an arbitrary direction. Where, the x-coordinate is time, unit s, the y-coordinate is acceleration, unit is g.

The multi-dimensional vibration control method of the strut tail-supported aircraft model is evaluated by the acceleration data measured by the pitch acceleration sensor 6 and the yaw acceleration sensor 7. As shown in FIG. 6, when the pitching direction is hammered, the multi-dimensional vibration control method of the strut tail-supported aircraft model is not used, and the vibration attenuation time of the aircraft model 5 in the pitching direction is 21.49 s. After using the multi-dimensional vibration control method of the strut tail-supported aircraft model, the vibration attenuation time of aircraft model 5 in pitch direction is 1.22 s, and the vibration in pitch direction can be controlled effectively. As shown in FIG. 7, when hammering in the yaw direction, the multi-dimensional vibration control method of the strut tail-supported aircraft model is not used, and the vibration attenuation time of the aircraft model 5 in the yaw direction is 10.45 s. After using the multi-dimensional vibration control method of the strut tail-supported aircraft model, the attenuation time of the yaw direction vibration of the aircraft model 5 is 1.23 s, and the yaw direction vibration can be effectively controlled. As shown in FIGS. 8 and 9, when hammering in any direction, the strut tail-supported aircraft model multi-dimensional vibration control method is not used, the vibration attenuation time of the aircraft model 5 in the pitching direction is 18.85 s, and the yaw direction vibration attenuation time is 11.35 s. After using the multi-dimensional vibration control method of the strut tail-supported aircraft model, the vibration attenuation time of the aircraft model 5 in the pitching direction is 1.03 s, the attenuation time of the yaw vibration is 0.98 s. The results show that the vibration of the aircraft model in any direction can be effectively controlled.

The invention claimed is:

1. A multi-dimensional vibration control method for a strut tail-supported aircraft model, wherein the method is through the arrangement in the aircraft model on the center of mass of pitch and yaw acceleration sensor measuring aircraft model, the main vibration acceleration of two component, calculate a main vibration vector and determine a strut real-time aircraft model plane, introduction of inertial force to solve a multidimensional active vibration damper on an active section by dynamic bending moment, and then obtain an initiative stress distribution on the active section, through the real-time vibration plane space position relation of multidimensional vibration damper to participate in the work of piezoelectric ceramic actuator serial number; a vibration control force is calculated in real time according to the stress on the active section of a piezoelectric ceramic actuator, and then the dynamic bending moment is generated in the process of a reverse bending moment resisting the vibration of the aircraft model; the multi-dimensional vibration active control system based on the piezoelectric ceramic actuator is adopted to control the multi-dimensional vibration; the specific steps are as follows:

step 1: establish an absolute coordinate system of the aircraft model support system the absolute coordinate system OXYZ (E) is established on an aircraft tail strut (4), and the coordinate origin is established in the equilibrium position at the intersection of the active section (F) and the axis of the aircraft tail strut (4), which is defined as O; the direction of the X axis coincides with the balance position of the axis of the aircraft tail strut (4) and points to the aircraft model (5),the direction of the Y axis is that the intersection of the active section (F) and the pitching plane points upward; the Z axis is determined by the right manipulation; a vibration measurement coordinate system $O_A X_A Y_A Z_A$(A) is established on the aircraft model (5), whose origin is established at the intersection of the centroid of the aircraft model (5) and the X axis of the absolute coordinate system OXYZ (E), which is defined as that the direction of the $O_A$;

$X_A$ coordinate axis coincides with the X axis of the absolute coordinate system OXYZ (E), the $Y_A$ coordinate axis and the Y axis of the absolute coordinate system OXYZ (E) point upward, and the $Z_A$ coordinate axis is determined by right manipulation;

step 2: obtain the components of the main vibration acceleration in the pitch plane and yaw plane in real time using a pitching accelerometer (6) and a yaw accelerometer (7) at the centroid of the aircraft model (5) to measure the acceleration of the main vibration in the pitch plane and yaw plane perpendicular to each other, the acceleration of the main vibration is fed back to a real-time controller (8) controlled by an upper computer (9), and a plurality of acceleration sampling values of the pitch plane and the yaw plane are collected in each vibration control cycle, the acceleration components of the main vibration acceleration in the pitch direction and yaw direction in a vibration control cycle are calculated by formulas (1) and (2) respectively:

$$a_{pith}(t) = \frac{\sum_{i=1}^{N} a_{pithi}}{N} \quad (1)$$

$$a_{yaw}(t) = \frac{\sum_{i=1}^{N} a_{yawi}}{N} \quad (2)$$

among them, the acceleration component of the $a_{pith}(t)$ main vibration acceleration in the pitch direction, the acceleration component of the $a_{yaw}(t)$ main vibration acceleration in the yaw direction, $a_{pithi}(t)$, $a_{yawi}(t)$ is the acceleration sampling value of the aircraft model (5) in the pitching plane and the yaw plane at the i sampling time, and N is the number of acceleration sampling values in each vibration control cycle, wherein i=1,2... N;

step 3: solve the main vibration acceleration vector in real time the main vibration acceleration is obtained by combining the acceleration components in the pitching direction and yaw direction; the main vibration acceleration consists of magnitude and direction; the main vibration acceleration vector is constructed by solving the magnitude and direction of the main vibration acceleration vector in each vibration control cycle in real time by using formulas (3) and (4):

$$|a(t)| = \sqrt{a_{pith}^2 + a_{yaw}^2} \quad (3)$$

$$\angle a(t) = \arctan\left(\frac{a_{pith}(t)}{a_{yaw}(t)}\right), \angle a(t) \in (-\pi, \pi) \quad (4)$$

among them, a(t) is the main vibration acceleration vector, |a(t)| is the magnitude of the a(t) vibration acceleration vector, and ∠a(t) is the main vibration acceleration vector in a(t) directions;

step 4: establish a real-time vibration active control coordinate system of the aircraft model and determine the real-time vibration plane of the strut the real-time active vibration control coordinate system $O_\alpha X_\alpha Y_\alpha Z_\alpha(D)$ is established on the active section (F), and its origin coincides with the origin O of the absolute coordinate system OXYZ (E); it is defined that the direction of the $O_\alpha$; $X_\alpha$ axis coincides with the direction of the X coordinate of the absolute coordinate OXYZ (E), the $Y_\alpha$ axis coincides with the a(t) direction of the main vibration acceleration vector, and the $Z_{60}$ coordinate axis is determined by the right manipulation; plane $X_\alpha O_\alpha Y_\alpha$ is the real-time vibration plane $X_\alpha O_\alpha Y_\alpha(C)$ of the strut; because of the randomness of the vibration of the aircraft model (5), the real-time active vibration control coordinate system $O_\alpha X_\alpha Y_\alpha Z_\alpha$ (D) changes with time, and the real-time vibration plane $X_\alpha O_\alpha Y_\alpha(C)$ changes with time;

step 5: the real-time inertial force and the stress distribution on the active section of the support system are solved on the real time vibration plane $X_\alpha O_\alpha Y_\alpha(C)$ of the aircraft tail strut (4), the inertia force is solved in real time by formula (5)

$$F_I(t) = -m_{eq} a(t) \quad (5)$$

formula (6) was used to calculate the dynamic bending moment on the active section (F) in real time $$M(t) = F_I(t) \cdot L \quad (6)$$

a dynamic stress distribution on the active section (F) was solved in real time by formula (7)

$$\sigma(y_a, z_a, t) = \frac{M(t) \cdot y_a}{I_{z_\alpha}(t)} \quad (7)$$

among them, $m_{eq}$ is the equivalent mass of the support system, $F_I(t)$ is the real-time inertia force acting on the aircraft model (5), M(t) is the dynamic bending moment on the active section (F) of the aircraft model (5) during vibration, L is the distance from the centroid of the aircraft model (5) to the active section (F), $\sigma(y_a, z_a, t)$ is the dynamic stress at the length of the active section (F) inner distance $X_\alpha$ coordinate axis $y_a$, and $I_{z_\alpha}(t)$ is the real time inertia moment of the active section (F) to the $Z_\alpha$ coordinate axis;

step 6: determine the serial number of the piezoelectric ceramic actuator in real time and calculate the vibration control force a number of the piezoelectric ceramic actuators (3-1) are uniformly arranged in the circumferential direction of the multi-dimensional vibration damper (3) at the active section (F), the uniformly distributed circumferential radius is R, and the piezoelectric ceramic which coincides with the Z axis of the absolute coordinate system OXYZ (E) is set as No. 0 piezoelectric ceramic actuator (3-1), the No. 1 piezoelectric ceramic actuator (3-1), the No. 2 piezoelectric ceramic actuator (3-1), . . . , the No. n piezoelectric ceramic actuator (3-1), are arranged in a counterclockwise circular array in turn; the array angle between two adjacent piezoelectric ceramic actuators (3-1) is $$\Delta\alpha = \frac{2\pi}{n+1};$$

in the real-time active vibration control coordinate system $O_\alpha X_\alpha Y_\alpha Z_\alpha(D)$, the piezoelectric ceramic actuator (3-1) above the $Z_\alpha$ axis participates in the vibration control, and the serial number of the piezoelectric ceramic actuator (3-1) participating in the work is:

$$n_c \in \left[\text{INT}\left(\frac{\alpha(t) - \frac{\pi}{2}}{\Delta\alpha} + 1\right), \text{INT}\left(\frac{\alpha(t) + \frac{\pi}{2}}{\Delta\alpha}\right)\right] \quad (8)$$

among them, $$\text{INT}\left(\frac{\alpha(t) - \frac{\pi}{2}}{\Delta\alpha} + 1\right) \text{ and } \text{INT}\left(\frac{\alpha(t) + \frac{\pi}{2}}{\Delta\alpha}\right)$$

represent the rounding of the calculated values of $$\frac{\alpha(t) - \frac{\pi}{2}}{\Delta\alpha} + 1 \text{ and } \frac{\alpha(t) + \frac{\pi}{2}}{\Delta\alpha}$$

respectively, $\alpha(t)$ is an angle between the main vibration acceleration vector a(t) and the Z axis of the absolute coordinate system OXYZ (E), and then the real-time coordinates of the center of the piezoelectric ceramic actuator (3-1) in the real-time active vibration control coordinate system $O_\alpha X_\alpha Y_\alpha Z_\alpha$(D) are determined as follows:

$$(z_{an_c}(t), y_{an_c}(t)) = \qquad (9)$$
$$\left(R \cdot \cos[\alpha_{n_c} - (\alpha(t) - \frac{\pi}{2})], R \cdot \sin[\alpha_{n_c} - (\alpha(t) - \frac{\pi}{2})]\right)$$

where, $\alpha_{n_c}$, is the angle between participating piezoelectric ceramic actuator (3-1) and the Z axis direction of the absolute coordinate system OXYZ (E), and the resultant force on the active section (F) of the participating piezoelectric ceramic actuator (3-1) is:

$$F_{n_c}(t) = \int_{A_{n_c}} \sigma(y_a, z_a, t) dA_{n_c} \qquad (10)$$

where, $A_{n_c}$ is the contact area between no. $n_c$ participating piezoelectric ceramic actuator (3-1) and the active section (F), and resistance required by the no. $n_c$ participating piezoelectric ceramic actuator (3-1) is:

$$F_{Rn_c}(t) = -F_{n_c}(t) \qquad (11)$$

finally, all the participating piezoelectric ceramic actuators (3-1) generate the reverse bending moment $M_R$(t) to resist the dynamic bending moment M(t) generated during the vibration of the aircraft model (5).

2. The multi-dimensional vibration control method of a strut tail-supported aircraft model according to claim 1, wherein the multi-dimensional vibration control method for the model of the strut tail braced aircraft adopts a multi-dimensional vibration active control system, which is mainly composed of the pitch acceleration sensor (6), the yaw acceleration sensor (7), the real-time controller (8), the upper computer (9), a piezoelectric ceramic actuator power amplifier group (10) and the multi-dimensional vibration damper (3); the pitch acceleration sensor (6) is installed on the centroid of the aircraft model (5) in the pitching plane and is used to measure the vibration acceleration component of the main vibration of the aircraft model (5) in the pitching plane; the yaw acceleration sensor (7) is installed on the centroid of the aircraft model (5) in the yaw plane and is used to measure the vibration acceleration component of the main vibration of the aircraft model (5) in the yaw plane; the multi-dimensional vibration damper (3) includes a plurality of uniformly distributed piezoelectric ceramic actuators (3-1), each of which is pretightened by a pretightening mechanism (3-2), respectively, to ensure a reliable output of the dynamic force of the piezoelectric ceramic actuator (3-1); the multi-dimensional vibration damper (3) is installed in the real-time vibration plane $X_\alpha O_\alpha Y_\alpha$(C) of the aircraft tail strut (4), the real-time controller (8) is connected with the upper computer (9), and the upper computer (9) is used to control the real-time controller (8) and monitor the vibration control process; the real-time controller (8) is connected with the pitch acceleration sensor (6) and the yaw acceleration sensor (7) respectively to obtain the vibration acceleration components in the pitching plane and the yaw plane of the aircraft model (5) in real time; the real-time controller (8) is connected to a piezoelectric ceramic actuator power amplifier group (10), and a plurality of piezoelectric ceramic actuator power amplifiers (10-1) in the piezoelectric ceramic actuator power amplifier group (10) are respectively connected to a plurality of piezoelectric ceramic actuators (3-1) in the multi-dimensional vibration damper (3).

* * * * *